(12) United States Patent
Arai et al.

(10) Patent No.: US 9,338,884 B2
(45) Date of Patent: May 10, 2016

(54) LAMINATED BODY AND MANUFACTURING PROCESS THEREFOR

(75) Inventors: Koutarou Arai, Joetsu (JP); Yasuhiro Seta, Sodegaura (JP); Kazuyuki Ogawa, Ichihara (JP)

(73) Assignee: Nippon Soda Co., Ltd., Tokyo (JP)

( * ) Notice: Subject to any disclaimer, the term of this patent is extended or adjusted under 35 U.S.C. 154(b) by 85 days.

(21) Appl. No.: 14/237,408

(22) PCT Filed: Aug. 8, 2012

(86) PCT No.: PCT/JP2012/070221
§ 371 (c)(1),
(2), (4) Date: Feb. 6, 2014

(87) PCT Pub. No.: WO2013/022032
PCT Pub. Date: Feb. 14, 2013

(65) Prior Publication Data
US 2014/0251666 A1 Sep. 11, 2014

(30) Foreign Application Priority Data
Aug. 10, 2011 (JP) .................................. 2011-175149

(51) Int. Cl.
*H05K 1/09* (2006.01)
*C23C 18/12* (2006.01)
(52) U.S. Cl.
CPC ............ *H05K 1/092* (2013.01); *C23C 18/1216* (2013.01); *C23C 18/1229* (2013.01); *C23C 18/1258* (2013.01); *C23C 18/1291* (2013.01)
(58) Field of Classification Search
USPC ............................ 174/257, 256; 427/532, 600
See application file for complete search history.

(56) References Cited

U.S. PATENT DOCUMENTS

| 5,695,819 | A | 12/1997 | Beinglass et al. |
| 2009/0042150 | A1 | 2/2009 | Yamada et al. |
| 2010/0021695 | A1 | 1/2010 | Naoyuki et al. |
| 2010/0089623 | A1* | 4/2010 | Jang et al. ............... 174/257 |
| 2013/0149485 | A1* | 6/2013 | Furukawa et al. ........... 428/76 |

FOREIGN PATENT DOCUMENTS

| CN | 101185384 A | 5/2008 |
| CN | 101557927 A | 10/2009 |
| JP | 61-244025 A | 10/1986 |
| JP | 01-132004 A | 5/1989 |
| JP | 11-500099 A | 1/1999 |
| JP | 11-054457 A | 2/1999 |

(Continued)

OTHER PUBLICATIONS

Office Action mailed May 14, 2014, in TW 101128739, with English translation.
International Search Report dated Sep. 11, 2012, in PCT/JP2012/070221.
Office Action dated Jun. 1, 2015, in CN 201280038516.4, with English translation of search report.

(Continued)

*Primary Examiner* — Andargie M Aychillhum
(74) *Attorney, Agent, or Firm* — Foley & Lardner LLP

(57) ABSTRACT

Disclosed is a laminated body including a substrate having an unevenness with an aspect ratio of 1.5 to 100 in the surface thereof, and a conductive film that is laminated in an approximately uniform thickness on a bottom, side wall surfaces, and an apex of the unevenness, the conductive film being any one film selected from the group consisting of an ITO film, an FTO film, a $SnO_2$ film, an ATO film, an AZO film, a GZO film, an IZO film, and an IGZO film.

10 Claims, 11 Drawing Sheets

(56) References Cited

FOREIGN PATENT DOCUMENTS

| | | |
|---|---|---|
| JP | 2004-018913 A | 1/2004 |
| JP | 2004-026554 A | 1/2004 |
| JP | 2004-039269 A | 2/2004 |
| JP | 2006-015332 A | 1/2006 |
| JP | 2006-160600 A | 6/2006 |
| JP | 2011-009307 A | 1/2011 |
| JP | 2011-511464 A | 4/2011 |
| WO | WO 97/20783 A1 | 6/1997 |
| WO | WO 2009/097627 A2 | 8/2009 |

OTHER PUBLICATIONS

Office Action dated Jun. 2, 2015, in JP 2013-528051, with English translation.

Kong et al., "Conformal Coating of Conductive ZnO:Al Films as Transparent Electrodes on High Aspect Ratio Si Microrods," Electrochemical and Solid-State Letters, 2010, 13(2):K12-K14.

Office Action dated Feb. 2, 2016, in JP 2013-528051, with English translation.

* cited by examiner

LAMINATED BODY AND MANUFACTURING PROCESS THEREFOR

TECHNICAL FIELD

The present invention relates to a laminated body and a manufacturing process therefor, and more particularly, to a laminated body including a substrate having an unevenness in the surface thereof, and a conductive film laminated in an approximately uniform thickness on a bottom, side wall surfaces, and an apex of the unevenness, and the manufacturing process therefor.

CROSS-REFERENCE TO RELATED APPLICATIONS

This application is a National Stage application of PCT/JP2012/070221, filed Aug. 8, 2012, which claims priority from Japanese Patent Application No. 2011-175149, filed Aug. 10, 2011, the content of which is incorporated herein by reference.

BACKGROUND ART

As a transparent conductive film, an ITO (tin-doped indium oxide) film, an FTO (fluorine-doped tin oxide) film, a $SnO_2$ (tin dioxide) film, an ATO (antimony-doped tin oxide) film, an AZO (aluminum-doped zinc oxide) film, a GZO (gallium-doped zinc oxide) film, an IZO (indium-doped zinc oxide) film, an IGZO (indium gallium zinc oxide composite) film, and the like are known. Laminated bodies, which are obtained by preparing these transparent conductive films on various substrates, are used in, for example, flat panel displays (a liquid crystal display, an electroluminescence display, and the like), planar heat generating bodies, touch panels, solar cells, semiconductor devices, and the like.

The conductive film may be manufactured using a process such as a sputtering process, a CVD process (chemical vapor deposition process), and an SPD process (spray pyrolysis decomposition process).

It is necessary to form the conductive film on not only a substrate having a flat surface such as a glass substrate but also a substrate having an unevenness in the surface thereof. When the conductive film is laminated on the substrate having an unevenness in the surface thereof using the sputtering process, there is a tendency that a difference in a film thickness between a flat surface and a side wall surface in the unevenness occurs. Therefore, the following attempts and the like have been made. That is, the side wall surface is made into a slope (PTL 2) and a film is formed while applying a bias voltage to a substrate (PTL 1).

The SPD process is a film forming process of precipitating a solid phase from a liquid phase that is sprayed onto a heated substrate and of depositing the solid phase as a thin film. That is, when a raw material solution is sprayed toward the heated substrate on the basis of the principle of spray, a thin film is formed by evaporation of a solvent and a pyrolysis and a chemical reaction of a solute along with the evaporation of the solvent. A pyrosol process is a method in which atomization of the solution is carried out by ultrasonic vibration. PTL 3 discloses a manufacturing process of a substrate to which a transparent conductive film is provided. In this process, the transparent conductive film is formed on a base substance, which has a curved surface shape or an irregular shape, directly or through an intermediate film using the pyrosol process. Examples of the base substance include a sheet-shaped base substance (substrate) that partially has a curved surface shape or an irregular shape, a honeycomb-shaped base substance, a fibrous base substance, a spherical base substance, and a foamed base substance.

CITATION LIST

Patent Literature

[PTL 1] Japanese Unexamined Patent Application, First Publication No. 11-54457
[PTL 2] Japanese Unexamined Patent Application, First Publication No. 2011-9307
[PTL 3] Japanese Unexamined Patent Application, First Publication No. 2004-39269

SUMMARY OF INVENTION

Technical Problem

An object of the present invention is to provide a laminated body including: a substrate that has an unevenness with a complicated shape in the surface thereof; and a conductive film that is laminated in an approximately uniform thickness on a bottom, side wall surfaces, and an apex of the unevenness, and a manufacturing process of the laminated body.

Solution to Problem

The present invention has the following aspects.

[1] A laminated body including: a substrate having an unevenness with an aspect ratio of 1.5 to 100 in a surface thereof; and a conductive film that is laminated in an approximately uniform thickness on a bottom, side wall surfaces, and an apex of the unevenness, the conductive film being any one selected from the group consisting of an ITO film, an FTO film, a $SnO_2$ film, an ATO film, an AZO film, a GZO film, an IZO film, and an IGZO film.

[2] The laminated body according to [1], wherein the conductive film is the ITO film.

[3] The laminated body according to [1] or [2], wherein the unevenness is formed by needle-shaped protrusions, columnar protrusions, longitudinal holes, micropores, or grooves.

[4] The laminated body according to any one of [1] to [3], wherein a step coverage ratio of the conductive film is 60 to 120%.

[5] The laminated body according to any one of [1] to [4], wherein the conductive film is obtained by a pyrosol process.

[6] A manufacturing process of the laminated body of [2], including: preparing an ITO film on a substrate having an unevenness with an aspect ratio of 1.5 to 100 in a surface thereof using a pyrosol process in which a solution containing: an indium compound represented by Formula (I): $In(R^1COCHCOR^2)_3$ (in Formula (I), $R^1$ and $R^2$ each independently represent an alkyl group having 1 to 10 carbon atoms or a phenyl group); and a tin compound represented by Formula (II): $(R^3)_2Sn(OR^4)_2$ (in Formula (II), $R^3$ represents an alkyl group having 1 to 10 carbon atoms and $R^4$ represents an alkyl group having 1 to 10 carbon atoms or an acyl group having 1 to 10 carbon atoms) is used.

[7] A manufacturing process of the laminated body of [2], including: atomizing a solution containing an indium compound represented by Formula (I):
$In(R^1COCHCOR^2)_3$ (in Formula (I), $R^1$ and $R^2$ each independently represent an alkyl group having 1 to 10 carbon atoms or a phenyl group) and a tin compound represented by Formula (II): $(R^3)_2Sn(OR^4)_2$ (in Formula (II), $R^3$ represents an alkyl group having 1 to 10 carbon atoms, and $R^4$ represents an alkyl group having 1 to 10 carbon atoms or an acyl group having 1 to 10 carbon atoms); heating a substrate having an unevenness with an aspect ratio of 1.5 to 100 in a surface thereof; bringing the resultant atomized material into contact with the substrate that is heated; and thermally decomposing the indium compound and the tin compound on the substrate to prepare an ITO film.

[8] The manufacturing process according to [6] or [7], wherein a heating temperature of the substrate is 300° C. to 800° C.

[9] The manufacturing process according to any one of [6] to [8], wherein the unevenness is formed by needle-shaped protrusions, columnar protrusions, longitudinal holes, micropores, or grooves.

[10] The manufacturing process according to any one of [6] to [9], wherein the ITO film is formed in such a manner that a step coverage ratio becomes 60 to 120%.

[11] The manufacturing process according [10], wherein the ITO film may be formed in such a manner that a step coverage ratio becomes 80 to 120%.

Advantageous Effects of Invention

According to the manufacturing process of the present invention, it is possible to easily obtain a laminated body including: a substrate that has an unevenness with a complicated shape in the surface thereof; and a conductive film that is laminated in an approximately uniform thickness on a bottom, side wall surfaces, and an apex of the unevenness. According to the manufacturing process of the present invention, it is possible to form a conductive film in an approximately uniform thickness, for example, even in a case of a large contact hole and the like in which an aspect ratio is large. As a result, contact failure does not occur.

The laminated body of the present invention may be used in flat panel displays (a liquid crystal display, an electroluminescence display, and the like), planar heat generating bodies, touch panels, semiconductor devices, and the like.

DESCRIPTION OF EMBODIMENTS

The present inventors have found that when film formation is carried out onto a substrate in a heated state using a pyrosol process, a conductive film can be formed in an approximately uniform thickness with respect to a substrate having an unevenness with a complicated shape in a surface, and the present inventors have made a further examination on the basis of the finding and they have achieved the present invention.

A laminated body of the present invention includes a substrate and a conductive film that is laminated on the substrate.

The conductive film is any one film selected from the group consisting of an ITO film, an FTO film, a SnO$_2$ film, an ATO film, an AZO film, a GZO film, an IZO film, and an IGZO film, and the ITO film is preferable.

The substrate has an unevenness in a surface thereof.

Figure 3:
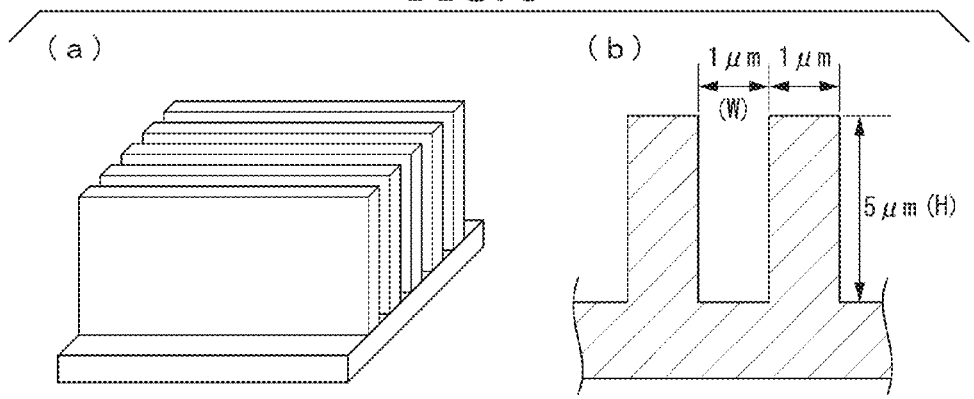
FIG. 3(a) is a perspective view illustrating a schematic structure of a substrate used in Examples 1 to 3 and having an unevenness (unevenness formed by grooves) in the surface thereof.
FIG. 3(b) is a partial cross-sectional view thereof.
Figure 11:
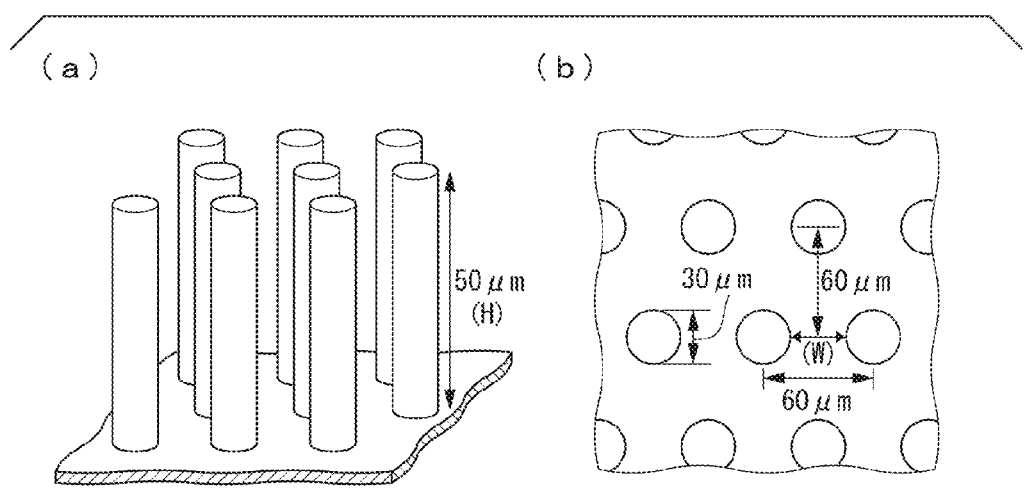
FIG. 11(a) is a perspective view illustrating a partial structure of a substrate used in Example 4 and having an unevenness (unevenness formed by columnar protrusions) in the surface thereof.
FIG. 11(b) is a top view thereof.

It is preferable that an aspect ratio of the unevenness be 1.5 to 100, more preferably 2 to 100, still more preferably 4 to 100, still more preferably 8 to 100, still more preferably 10 to 100, and still more preferably 15 to 100. As a preferable aspect of the unevenness, an unevenness formed by needle-shaped protrusions, columnar protrusions, longitudinal holes, micropores, or grooves (trenches) is an exemplary example. FIGS. 3(a) and 3(b) show a substrate having an unevenness formed by the trenches. FIGS. 11(a) and 11(b) show a substrate having an unevenness formed by the columnar protrusions.

The aspect ratio represents a ratio (H/W) of the depth H of a concave portion to an opening width W of the concave portion. In a case where the unevenness is formed by the columnar protrusions, the minimum width in a flat surface between adjacent columnar protrusions is set as the opening width W of the concave portion, and the height of the columnar protrusions (the length of a vertical line that is vertically drawn from an apex surface of each of the columnar protrusions (convex portions) to a bottom surface between the columnar protrusions (concave portions)) is set as the depth H of the concave portion. In a case where the unevenness is formed by the needle-shaped protrusions, the minimum width in a flat surface between apexes of the adjacent needle-shaped protrusion is set as the opening width W of the concave portion, and the height of the needle-shaped protrusions (the length of a vertical line that is vertically drawn from an apex surface of each of the needle-shaped protrusions (convex portions) to a bottom surface between the needle-shaped protrusions (concave portions)) is set as the depth H of the concave portion. Here, the flat surface typically represents a flat surface on the apex. In a case where the apex is sharp and thus the flat surface is not present, a surface formed by connecting three or more apexes is set as the flat surface.

It is preferable that the opening width W of the concave portion be 0.05 μm to 200 μm, more preferably 0.05 μm to 100 μm, still more preferably 0.05 μm to 50 μm, and still more preferably 0.05 μm to 10 μm.

Although not particularly limited, it is preferable that an inclination angle of a side wall surface of the unevenness be approximately perpendicular to the flat surface (described above), preferably more than 80° and equal to or less than 100° with respect to the flat surface, and more preferably 85° to 95°.

A material of the substrate is not particularly limited. Examples of the substrate material include inorganic materials such as glass, silicon, and silicon oxide, organic materials such as a resin and a rubber, and polymer compounds such as silicone.

The conductive film is laminated in an approximately uniform thickness on the bottom, the side wall surface, and the apex of the unevenness. Here, the "lamination in an approximately uniform thickness on the bottom, the side wall surface, and the apex of the unevenness" means that when measuring a film thickness of the laminated conductive film at least at one point on the apex surface of the convex portion, at least at one point on the bottom surface of the concave portion, and at least at two points of the side wall surface (with respect to the middle portion of the side wall surface (the midpoint thereof located at the middle between the apex surface of the convex portion and the bottom surface of the concave portion), one of which is an apex-side portion of the side wall surface which is located at an upper portion (between the middle portion and the apex surface of the convex portion), and another of which is a bottom-side portion of the side wall surface which is located at a lower portion (between the middle portion and the bottom surface of the concave portion)), the film thickness is approximately the same in each case. It is preferable that the conductive film be continuously laminated on the bottom, the side wall surface, and the apex of the unevenness.

An average thickness of the conductive film that is laminated is not particularly limited, and may be appropriately selected according to a use and the like. For example, in the case of the ITO film, when forming a conductive film having a sheet resistance value of 30 Ω/square or less, the average thickness is preferably 80 nm or more, when forming a conductive film having the sheet resistance value of 60 Ω/square to 200 Ω/square, the average thickness is preferably approximately 30 nm, and when forming a conductive film having the sheet resistance value of 200 Ω/square to 3000 Ω/square, the average thickness is preferably 10 nm to 25 nm.

It is preferable that a step coverage ratio of the conductive film laminated in an approximately uniform thickness be 60 to 120%, more preferably 80 to 120%, still more preferably 80 to 110%, still more preferably 90 to 100%, still more preferably 95 to 100%, and still more preferably 97 to 100%. In addition, the step coverage ratio, which is defined in the present invention, expresses a ratio of the average thickness of the conductive film laminated on the side wall surface to the thickness of the conductive film laminated on the apex surface of the convex portion as a percentage (=[average film thickness on the side wall surface/film thickness on the apex surface of the convex portion]×100(%)). In a case where the apex of the convex portion is too narrow, and thus it is difficult to determine the film thickness on the apex surface, for example, of the unevenness that is formed by the needle-shaped protrusions, the step coverage ratio is defined as [average film thickness on the side wall surface/film thickness at the uppermost portion of the side wall surface]×100(%).

The "average film thickness on the side wall surface" stated here represents an average value of a film thickness at least at one point (apex-side portion of the side wall surface) which is located at an upper portion from the midpoint of the side wall, and a film thickness at least at one point (bottom-side portion of the side wall surface) which is located at a lower portion from the middle of the side wall. In addition, the "film thickness at the uppermost portion" represents a film thickness that is measured at one point of the apex surface.

The conductive film may be prepared using various kinds of film forming processes, but in the present invention, it is preferable to prepare the conductive film using a pyrosol process.

A manufacturing process of a laminated body in a case of using the ITO film as the conductive film includes preparing the ITO film on a substrate having an unevenness with an aspect ratio of 1.5 to 100 in a surface thereof by performing the pyrosol process using a solution (hereinafter, may be referred to as a raw material solution) that contains an indium compound and a tin compound.

A preferred manufacturing process of the laminated body includes: atomizing a solution containing an indium compound and a tin compound (raw material solution); heating a substrate having an unevenness with an aspect ratio of 1.5 to 100 in the surface thereof; bringing the resultant atomized material into contact with the substrate that is heated; and thermally decomposing the indium compound and the tin compound on the substrate to prepare an ITO film.

The indium compound is not particularly limited as long as the indium compound is a compound that is thermally decomposed in the air and generates indium oxide, but an indium compound represented by Formula (I): $In(R^1COCHCOR^2)_3$ is preferable.

In Formula (I), $R^1$ and $R^2$ each independently represent an alkyl group having 1 to 10 carbon atoms or a phenyl group. Examples of the alkyl group having 1 to 10 carbon atoms in $R^1$ and $R^2$ include a methyl group, an ethyl group, an n-propyl group, an n-butyl group, a t-butyl group, and the like.

Examples of the indium compound that is more preferably used include tris(acetylacetonato)indium (In $(CH_3COCHCOCH_3)_3$).

The tin compound that is used in the present invention is not particularly limited as long as the tin compound is a compound that is thermally decomposed in the air and generates tin oxide, but a tin compound represented by Formula (II): $(R^3)_2Sn(OR^4)_2$ is preferable.

In Formula (II), $R^3$ represents an alkyl group having 1 to 10 carbon atoms, and $R^4$ represents an alkyl group having 1 to 10 carbon atoms or an acyl group having 1 to 10 carbon atoms.

Examples of the alkyl group having 1 to 10 carbon atoms in $R^3$ include a methyl group, an ethyl group, an n-propyl group, an n-butyl group, and a t-butyl group.

Examples of the alkyl group having 1 to 10 carbon atoms in $R^4$ include a methyl group, an ethyl group, an n-propyl group, an n-butyl group, a t-butyl group, and the like, and examples of the acyl group having 1 to 10 carbon atoms include an acetyl group, a propionyl group, and the like.

Examples of the tin compound that is more preferably used in the present invention include di-n-butyl tin diacetate $((n-Bu)_2Sn(OCOCH_3)_2)$.

A solvent that is used in the raw material solution is not particularly limited as long as the solvent is capable of dissolving the indium compound and the tin compound. Examples of the solvent include β-diketone compound such as acetylacetone, β-ketonic acid ester compound such as methyl acetoacetate and ethyl acetoacetate, β-dicarboxylic acid ester compound such as dimethyl malonate and diethyl malonate, and the like. Among these, acetylacetone is preferable considering that a great effect of the present invention is exhibited.

A ratio between the indium compound and the tin compound which are contained in the raw material solution is set in such a manner that an amount of tin elements derived from the tin compound is preferably less than 1 part by mass with respect to 1 part by mass of indium elements derived from the indium compound, more preferably 0.001 parts by mass to 0.5 parts by mass, and still more preferably 0.05 parts by mass to 0.35 parts by mass.

The total amount of the indium compound and the tin compound which are contained in the raw material solution is not particularly limited as long as the indium compound and the tin compound are capable of being dissolved in the solvent, but the total amount thereof is set in such a manner that the total of indium elements derived from the indium compound and tin elements derived from the tin compound becomes preferably 0.07 parts by mass or less with respect to 1 part by mass of a solvent, more preferably 0.00001 parts by mass to 0.07 parts by mass, and still more preferably 0.001 parts by mass to 0.04 parts by mass.

A group 2 element such as Mg, Ca, Sr, or Ba; a group 3 element such as Sc or Y; a lanthanoid such as La, Ce, Nd, Sm, or Gd; a group 4 element such as Ti, Zr, or Hf; a group 5 element such as V, Nb, or Ta; a group 6 element such as Cr, Mo, or W; a group 7 element such as Mn; a group 9 element such as Co; a group 10 element such as Ni, Pd, or Pt; a group 11 element such as Cu or Ag; a group 12 element such as Zn or Cd; a group 13 element such as B, Al, or Ga; a group 14 element such as Si, Ge, or Pb; a group 15 element such as P, As, or Sb; a group 16 element such as Se or Te; or the like is preferably contained as a third compound in the raw material solution. An elementary substance or a compound composed of the elements may be added to the raw material solution in order for the raw material solution to contain the third component.

An amount of elements of the third compound contained in the raw material solution is preferably approximately 0.05 to 20% by mole with respect to the indium elements derived from the indium compound. The amount of the elements of the third component, which is capable of being contained, is different depending on kinds of elements of the third component, and thus the kinds of elements and the amount thereof may be appropriately selected in order for the ITO film to have a desired resistance value.

The pyrosol process that is used in the present invention is a kind of spray pyrolysis decomposition process. Typically, the spray pyrolysis decomposition process includes atomizing a solution (raw material solution), heating a substrate using a heating device, bringing the resultant atomized material into contact with the substrate that is heated, and thermally decomposing a compound in the raw material solution on the substrate to form a film. Examples of the process of atomizing the raw material solution include a process using a spray nozzle, a process using an ultrasonic vibration, and the like. In the pyrosol process, the raw material solution is atomized using the ultrasonic vibration.

In the manufacturing process of the present invention, it is preferable to allow a carrier gas to flow so as to move the atomized material. In addition, it is preferable to bring the atomized material into contact with the substrate 8 that is heated. It is preferable that a flow rate of the carrier gas be adjusted to form a laminar flow in a supply passage 4. As the carrier gas, an oxidizing gas is preferable. Examples of a preferred oxidizing gas include oxygen, air, and the like. In addition, as the carrier gas, a carrier gas that is dried is preferable.

The substrate that is used in the manufacturing process of the present invention has an unevenness in a surface thereof. The preferred shape of the unevenness and the like are as described above.

A substrate heating temperature is preferably 300° C. to 800° C., more preferably 450° C. to 600° C., and still more preferably 480° C. to 560° C. The atomized material that is carried by the carrier gas is preferably supplied onto the substrate to flow in parallel with respect to a flat surface of the substrate, and more preferably in a laminar flow state in parallel with respect to the flat surface of the substrate.

Figure 1:
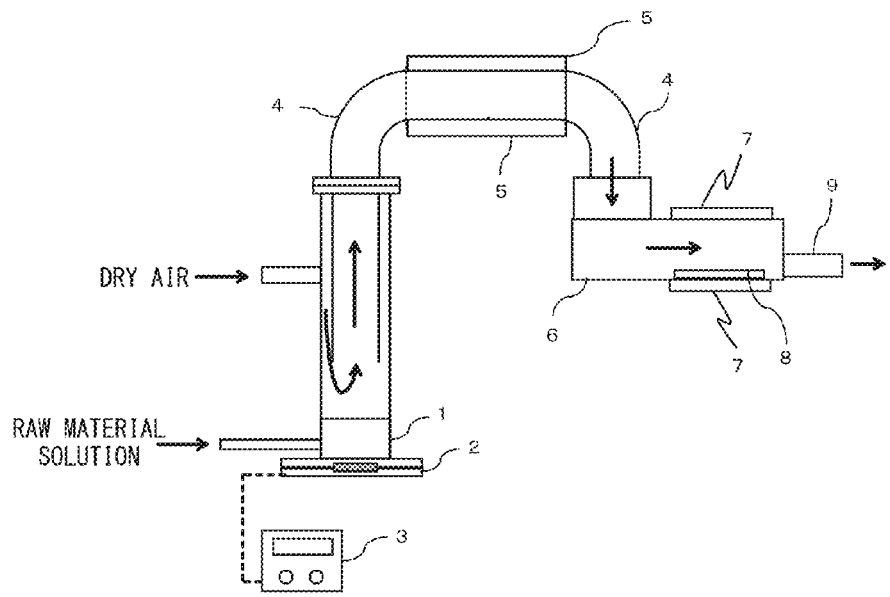
FIG. 1 is a cross-sectional view illustrating a schematic configuration of a kind of apparatus to carry out a manufacturing process of the present invention.

A film forming apparatus used to carry out the manufacturing process of the present invention is not particularly limited. FIG. 1 shows a view illustrating an example of a simple apparatus available to carry out the manufacturing process of the present invention.

In the apparatus shown in FIG. 1, a raw material solution that is collected in a raw material solution tank 1 is atomized by an ultrasonic atomizer 2. The resultant atomized material is carried by dry air and is sent to a film forming furnace 6 through the supply passage 4. A heater (preheating device) 5 is mounted to surround the supply passage 4, and the atomized material can be preheated by the heater 5. Heaters 7 are provided to a ceiling surface and a bottom surface of the film forming furnace 6, respectively. The substrate 8 is placed in the film forming furnace 6, and then the substrate 8 can be heated by the heaters 7. In the film forming furnace 6, the atomized material that is preheated flows in a laminar flow state in parallel with a surface of the substrate 8 that is heated, and the atomized material that is preheated comes into contact with the substrate that is heated. The atomized material that does not come into contact with the substrate is exhausted from an exhaust passage 9.

Figure 2:
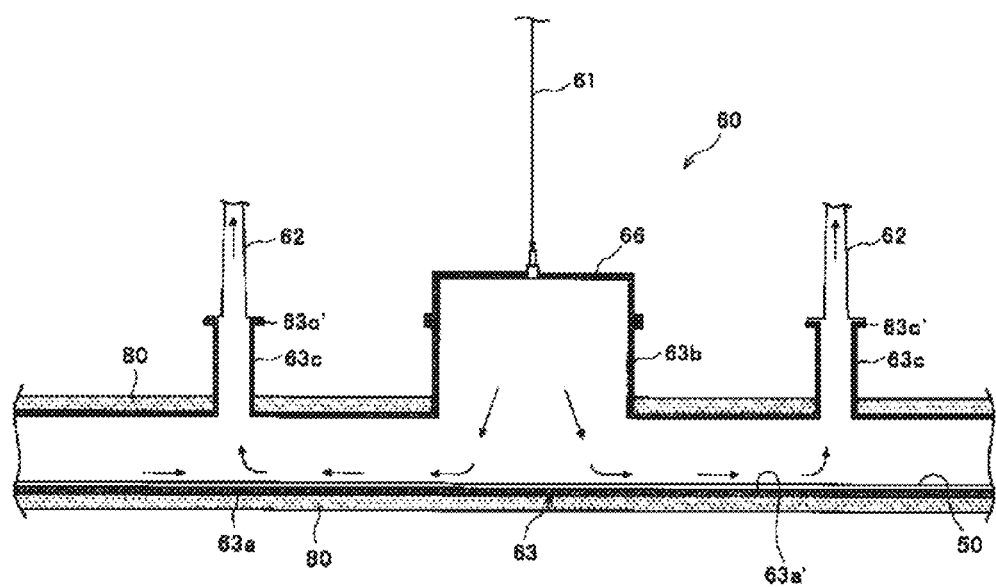
FIG. 2 is a cross-sectional view illustrating a schematic configuration of another kind of apparatus to carry out the manufacturing process of the present invention.

FIG. 2 shows a view illustrating another example of the apparatus used to carry out the manufacturing process of the present invention.

In a film forming furnace 60 shown in FIG. 2, it is possible to heat a substrate by a heater (heating device) 80 while conveying the substrate one by one by loading the substrate on a belt 50 of a belt conveyer (conveying device) that is horizontally provided. The raw material solution is atomized by an ultrasonic atomizer (not shown), and the resultant atomized material is introduced into the film forming furnace 60 from a supply passage 61. An inner space of a muffle main body 63 is demarcated in order for the atomized material to flow in parallel with a surface of the substrate and is exhausted from an exhaust passage 62. More specifically, the inner space of the muffle main body includes a conveying passage portion 63a that encloses the belt 50 and has an approximately rectangular cross-section, a chamber portion 63b that upwardly protrudes from an upper wall surface of the conveying passage portion 63a and has an approximately rectangular cross-section, and exhaust passage portions 63c that are upwardly protruded from the upper wall surface of the conveying passage portion 63a so that the chamber portion 63b is interposed therebetween in a conveying direction of a glass substrate. Each of the exhaust passage portions 63c forms one exhaust passage in combination with an exhaust passage 62 that is connected to a flange portion 63c' on an upper end side of the passage portion 63c. As shown in FIG. 2, the supply passage 61, which supplies the atomized material that is atomized from the raw material during formation of the ITO film, is connected to the chamber portion 63b. In addition, a lid 66 that covers an upper end opening of chamber portion 63b is detachably provided to the chamber portion 63b.

In a case of using a belt conveyer type film forming furnace, with regard to a direction in which the atomized material carried on a carrier gas flows, a state in which the atomized material flows from the right side of the substrate, a state in which the atomized material flows from the upper side of the substrate, and a state in which the atomized material flows from the left side of the substrate can be realized in this order during transfer of the substrate by the belt conveyer. A plurality of the belt conveyer type film forming furnaces may be connected (for example, at least three furnaces may be connected in series) and repetitive film formation may be carried out to obtain the ITO film having a desired thickness on the substrate.

The ITO film is formed on the substrate by performing the above-described process. After forming the ITO film, a heating treating (annealing) may be carried out as necessary. A temperature during the annealing is preferably 100° C. to 550° C., and more preferably 150° C. to 300° C. An annealing time is preferably 0.1 hours to 3 hours, and more preferably 0.3 hours to 1 hour. As an atmosphere during the annealing, the air, nitrogen, oxygen, hydrogen-added nitrogen, an organic solvent-added air, a nitrogen atmosphere, and the like are preferable.

In addition, in a case of forming an FTO film, a $SnO_2$ film, an ATO film, an AZO film, a GZO film, an IZO film, or an IGZO film as the conductive film, these films may be formed by the same process as the ITO film.

EXAMPLES

Next, the present invention will be described in more detail with reference to examples. However, the technical scope of the present invention is not limited by the examples.

Example 1

As the apparatus of forming the ITO film, an apparatus obtained by connecting three apparatuses shown in FIG. 2 in series was used. As the substrate, a silicon wafer substrate having an unevenness formed by trenches as shown in FIGS. 3(a) and 3(b), in which the opening width (W) of the concave portion was 1 μm, the opening depth (H) of the concave portion was 5 μm, and the aspect ratio thereof was 5, in the surface thereof was used. The heating temperature of the film forming furnace 60 was set to a range of 500° C. to 515° C.

A yellow transparent solution in a molar concentration of 0.12 mol/L was obtained by dissolving tris(acetylacetonato) indium ($In(AcAc)_3$) in acetylacetone. The raw material solution was prepared by adding di-n-butyl tin diacetate to the solution in such a manner that the content of tin elements became 0.05 moles with respect to 1 mole of indium elements (the content of the tin elements became 0.05 parts by mass with respect to 1 part by mass of the indium elements), and then dissolving the di-n-butyl tin diacetate in the solution.

The raw material solution was made into fine liquid droplets (mist) with ultrasonic waves of 800 kHz, and the liquid droplets were introduced to the film forming furnace 60 through the supply passage 61 in combination with dry air in a flow rate of 83 L/minute. A differential pressure between the exhaust passage 62 and the supply passage 61 was set to 30 Pa.

In a case of setting the above-described conditions, a supply rate of the raw material solution became 4.4 g/minute. When a gas that contains the liquid droplets at 500° C. is assumed as an ideal gas, a linear velocity of the gas that contains the liquid droplets at a film forming portion is 0.21 m/s.

The substrate was loaded on the belt 50 of the belt conveyer, and the substrate was conveyed at a velocity of 40 cm/minute to pass through the inside of the film forming furnace 60. After passing through three film forming furnaces 60, the substrate was subjected to a heating treatment (annealing) at 500° C. in a nitrogen atmosphere.

Figure 4:
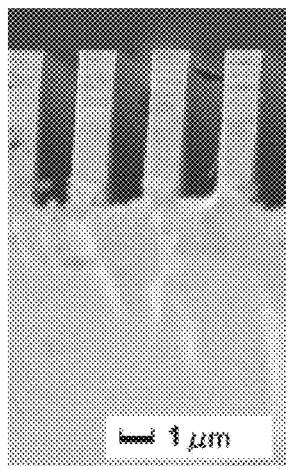
FIG. 4 is an electronic photograph of a surface that is obtained by cutting a laminated body obtained in Example 1 in a direction perpendicular to the longitudinal direction of grooves.
Figure 5:
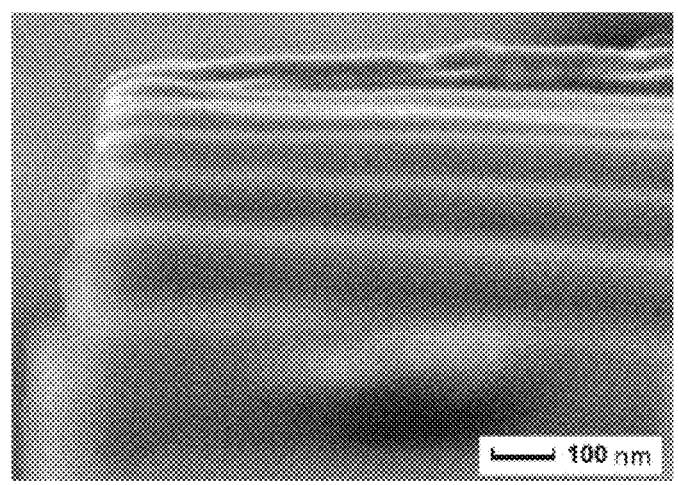
FIG. 5 is an electronic photograph of an apex surface of the laminated body obtained in Example 1.
Figure 6:
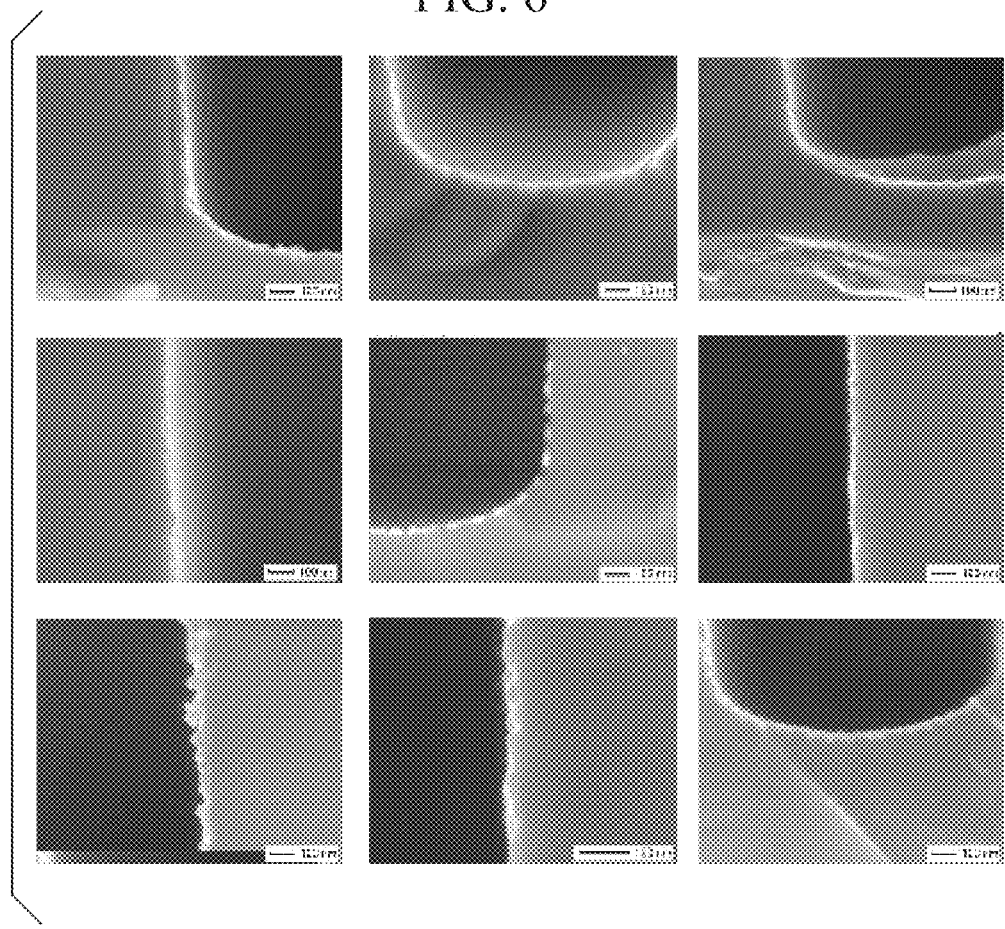
FIG. 6 is a high-magnification electronic photograph of the surface obtained by cutting the laminated body obtained in Example 1 in a direction perpendicular to the longitudinal direction of the grooves.

Electron microscopic images of a laminated body that was obtained by the above-described operation are shown in FIGS. 4 to 6. From the electron microscopic images, it can be seen that the ITO film was laminated in an approximately uniform thickness on the side wall surface, the bottom surface, and the apex surface of the unevenness in the substrate. The ITO film had a thickness of 45.0 nm at the apex surface of a convex portion, a thickness of 45.0 nm at an apex-side portion of the side wall surface, a thickness of 29.5 nm at the middle portion of the side wall surface, a thickness of 37.5 nm at a bottom-side portion of the side wall surface, and a thickness of 36.0 nm at the bottom surface of the concave portion. The step coverage ratio was 83%.

Example 2

As the apparatus of forming the ITO film, the apparatus shown in FIG. 1 was used. As the substrate, the same silicon wafer substrate as Example 1 was used.

A heating temperature by the heaters 7 was adjusted to approximately 500° C. In addition, a flow rate of a gas (dry air) in the film forming furnace 6 was set to 7 L/minute. The height of the film forming furnace 6 was set to 3 cm.

A yellow transparent solution in a molar concentration of 0.2 mol/L was obtained by dissolving tris(acetylacetonato) indium in acetylacetone. The raw material solution was prepared by adding di-n-butyl tin diacetate to the solution in such a manner that the content of tin elements became 0.05 moles with respect to 1 mole of indium elements (the content of the tin elements became 0.05 parts by mass with respect to 1 part by mass of the indium elements), and then dissolving the di-n-butyl tin diacetate in the solution.

The substrate 8 was placed on the bottom surface of the film forming furnace 6, and the substrate 8 was heated to 500° C. by the heater 7 provided on the bottom surface. The raw material solution was made into fine liquid droplets (mist) with ultrasonic waves of 800 kHz, and the liquid droplets were introduced to the film forming furnace 6 through the supply passage 4.

In a case of setting the above-described conditions, a supply rate of the raw material solution became 4.0 g/minute. When a gas that contains the liquid droplets at 500° C. is assumed as an ideal gas, a linear velocity of the gas that contains the liquid droplets at a film forming portion is 0.06 m/s. The raw material solution (fine liquid droplets) was continuously supplied at this supply rate to the film forming furnace 6 for 10 minutes. Then, a heating treatment (annealing) at 500° C. was carried out in a nitrogen atmosphere.

Figure 7:
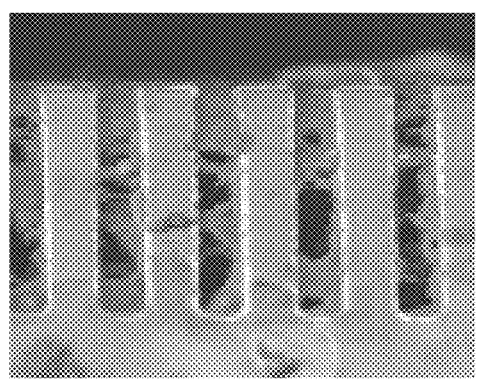
FIG. 7 is an electronic photograph of a surface obtained by cutting a laminated body obtained in Example 2 in a direction perpendicular to the longitudinal direction of grooves.
Figure 8:
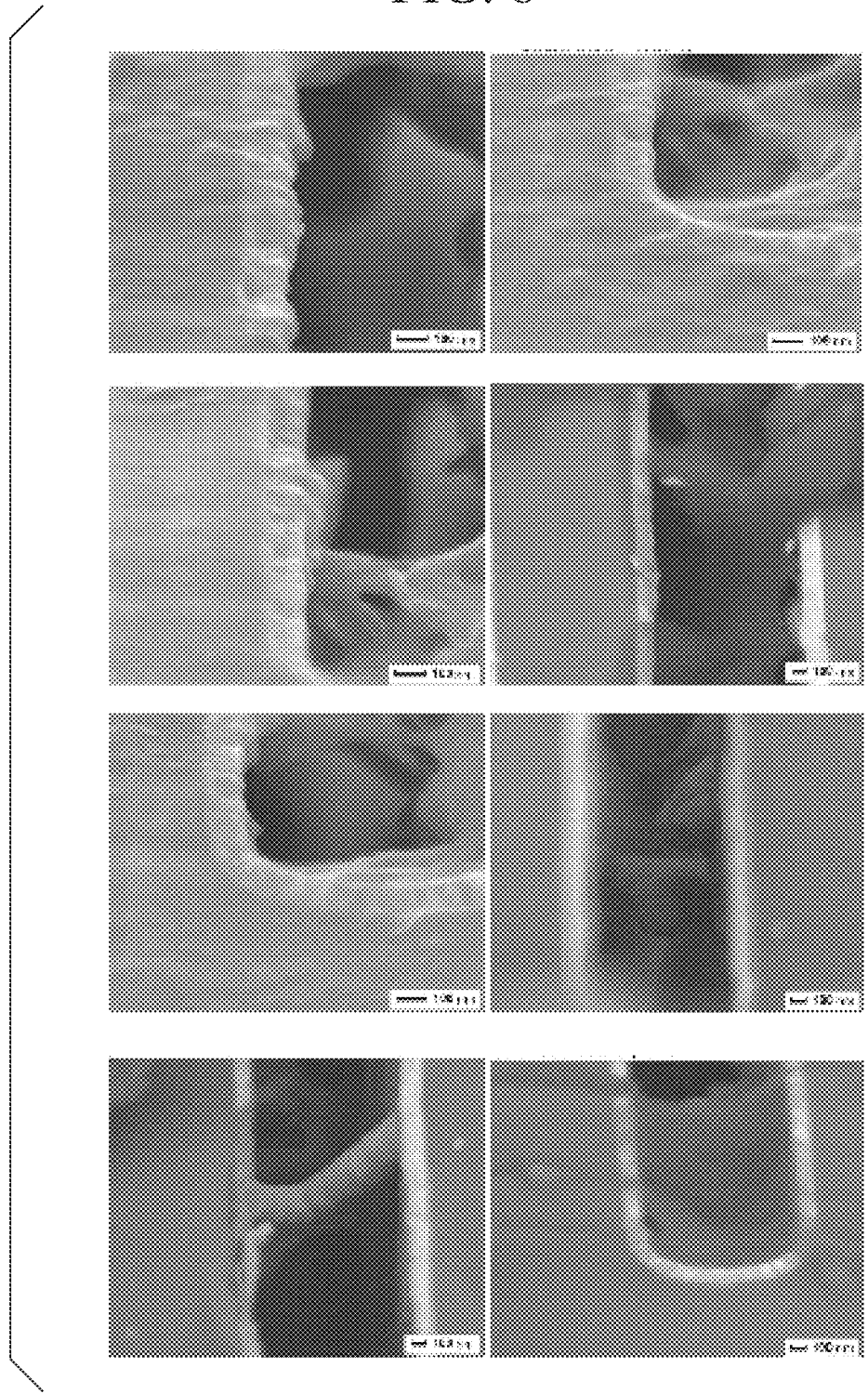
FIG. 8 is a high-magnification electronic photograph of the surface obtained by cutting the laminated body obtained in Example 2 in a direction perpendicular to the longitudinal direction of the grooves.

Electron microscopic images of a laminated body that was obtained by the above-described operation were shown in FIGS. 7 and 8. From the electron microscopic images, it could be seen that the ITO film was prepared in an approximately uniform thickness on the side wall surface, the bottom surface, and the apex surface of the unevenness in the substrate. The ITO film had a thickness of 125 nm at the apex surface of a convex portion, a thickness of 125 nm at an apex-side portion of the side wall surface, a thickness of 118 nm at the middle portion of the side wall surface, a thickness of 122 nm at a bottom-side portion of the side wall surface, and a thickness of 111 nm at the bottom surface of the concave portion. The step coverage ratio was 97%.

Example 3

A laminated body was obtained by the same process as Example 2 except that a supply time of the raw material solution (fine liquid droplets) was changed to 6 minutes.

Figure 9:
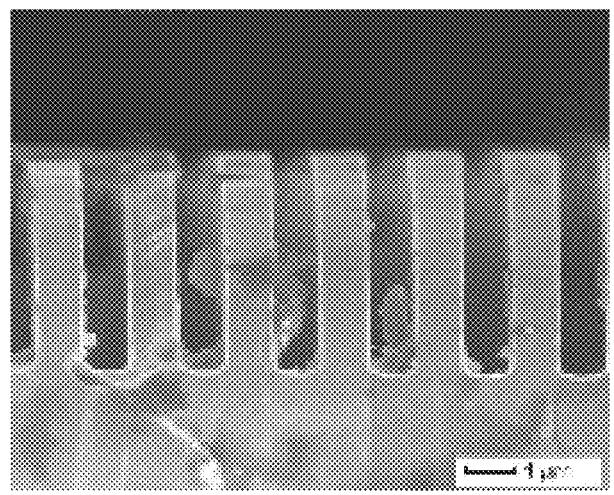
FIG. 9 is an electronic photograph of a surface obtained by cutting a laminated body obtained in Example 3 in a direction perpendicular to the longitudinal direction of grooves.
Figure 10:
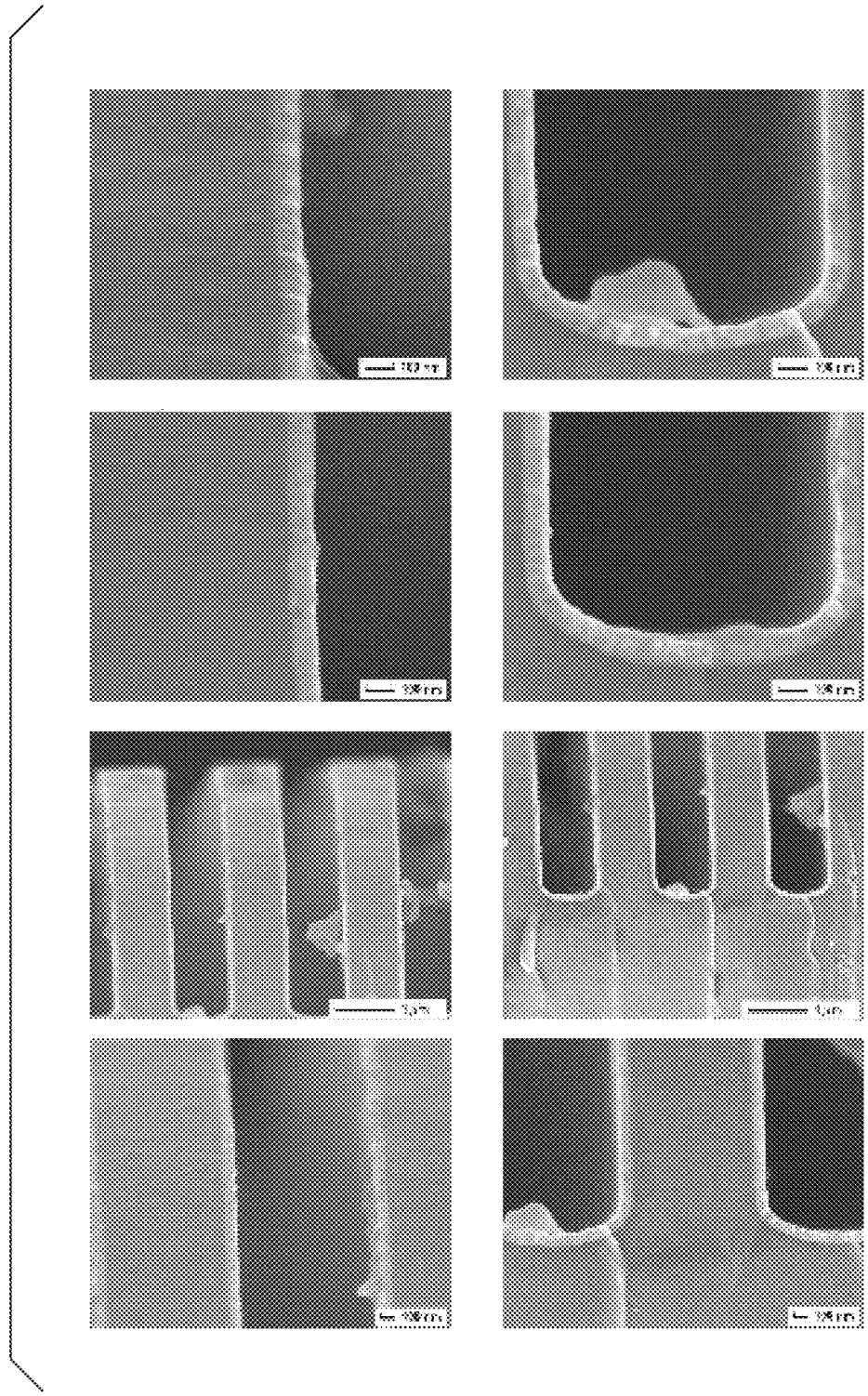
FIG. 10 is a high-magnification electronic photograph of the surface obtained by cutting the laminated body obtained in Example 3 in a direction perpendicular to the longitudinal direction of the grooves.

Electron microscopic images of a laminated body that was obtained by the above-described operation are shown in FIGS. 9 and 10. From the electron microscopic images, it can be seen that the ITO film was prepared in an approximately uniform thickness on the side wall surface, the bottom surface, and the apex surface of the unevenness in the substrate. The ITO film had a thickness of 89.0 nm at the apex surface of a convex portion, a thickness of 89.0 nm at an apex-side portion of the side wall surface, a thickness of 82.5 nm at the middle portion of the side wall surface, a thickness of 77.5 nm at a bottom-side portion of the side wall surface, and a thickness of 77.5 nm at the bottom surface of the concave portion. The step coverage ratio was 93%.

Example 4

As the apparatus of forming the ITO film, an apparatus obtained by connecting three apparatuses shown in FIG. 2 in series was used. As the substrate, a silicon wafer substrate having an unevenness as shown in FIGS. 11(a) and 11(b) was used. In the unevenness, columnar protrusions having a height of 50 µm and a diameter of 30 min were arranged in such a manner that triangles having a base of 60 µm and a height of 60 µm were continuously formed on a flat surface by the central portions of apexes of the columnar protrusions. Here, the depth (H) of a concave portion between the columnar protrusions was 50 µm, the minimum opening width (W) of the concave portion was 30 µm, and the aspect ratio thereof was 1.67. The temperature inside the film forming furnace 60 was set to a range of 504° C. to 507° C.

A yellow transparent solution in a molar concentration of 0.2 mol/L was obtained by dissolving tris(acetylacetonato) indium in acetylacetone. The raw material solution was prepared by adding di-n-butyl tin diacetate to the solution in such a manner that the content of the tin elements became 0.05 moles with respect to 1 mole of indium elements (the content of the tin elements became 0.05 parts by mass with respect to 1 part by mass of the indium elements), and then dissolving the di-n-butyl tin diacetate in the solution.

The raw material solution was made into fine liquid droplets (mist) with ultrasonic waves of 800 kHz, and the liquid droplets were introduced to the film forming furnace 60 through the supply passage 61 in combination with dry air in a flow rate of 83 L/minute. A differential pressure between the exhaust passage 62 and the supply passage 61 was set to 30 Pa.

In a case of setting the above-described conditions, a supply rate of the raw material solution became 4.35 g/minute. The substrate was loaded on the belt conveyer 50, and the substrate was conveyed at a velocity of 25 cm/minute to pass through the inside of the film forming furnace 60. After passing through three film forming furnaces, the substrate was subjected to a heating treatment (annealing) at 500° C. in a nitrogen atmosphere.

Figure 12:
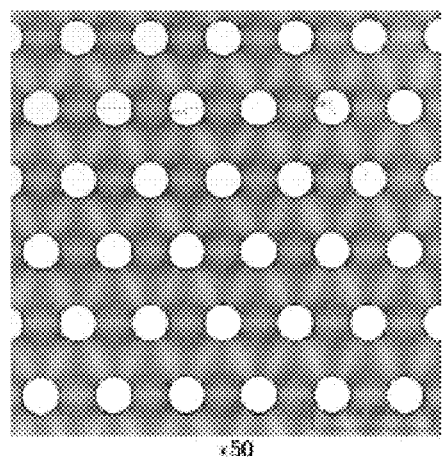
FIG. 12 is an electronic photograph taken from an upper surface of the substrate used in Example 4.
Figure 13:
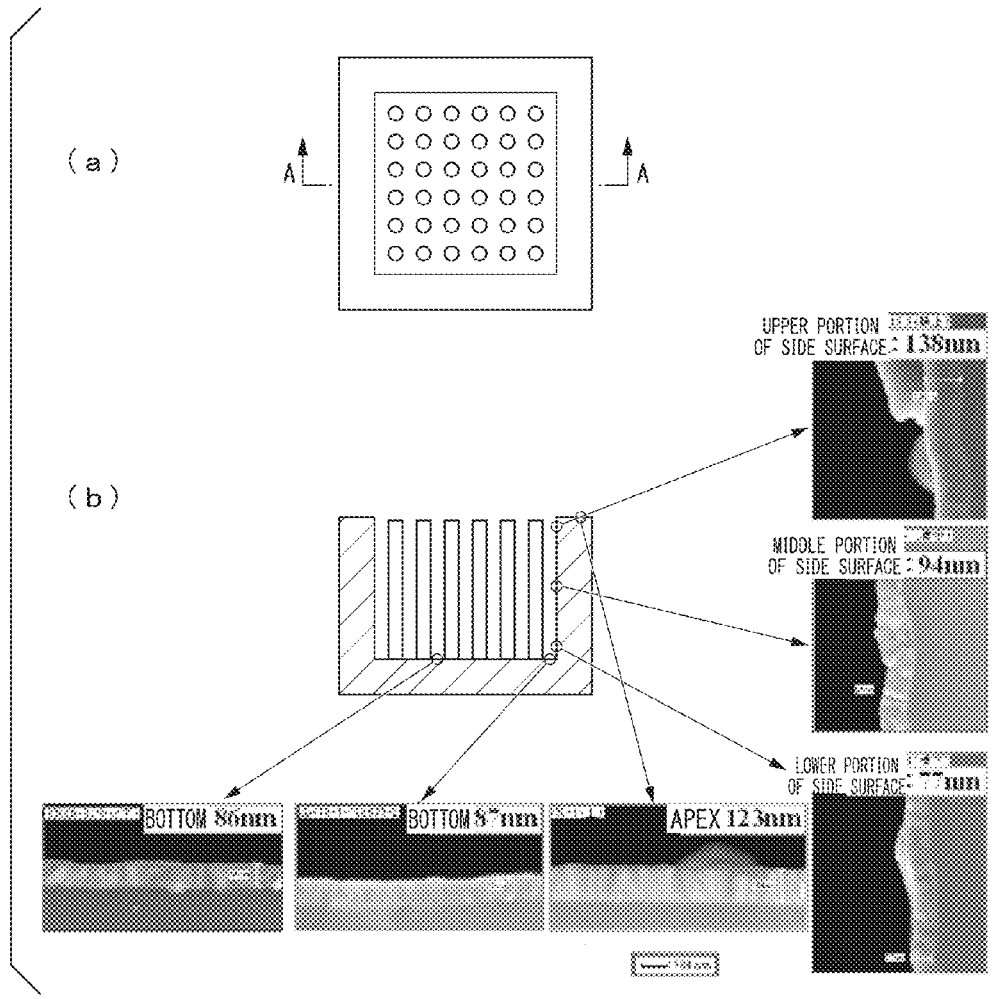
FIG. 13(a) is a schematic top view of a laminated body obtained in Example 4.
FIG. 13(b) is a high-magnification electronic photograph of a cross-section taken along a line A-A in FIG. 13(a).

Electron microscopic images of a laminated body that was obtained by the above-described operation are shown in FIGS. 12 and 13. From the electron microscopic images, it could be seen that the ITO film was prepared in an approximately uniform thickness on the side wall surface, the bottom surface, and the apex surface of the unevenness in the substrate. The ITO film had a thickness of 123 nm at the apex surface of a convex portion, a thickness of 138 nm at an apex-side portion of the side wall surface, a thickness of 94 nm at the middle portion of the side wall surface, a thickness of 77 nm at a bottom-side portion of the side wall surface, and a thickness of 87 nm at the bottom surface of the concave portion. The step coverage ratio was 84%.

Example 5

Figure 14:
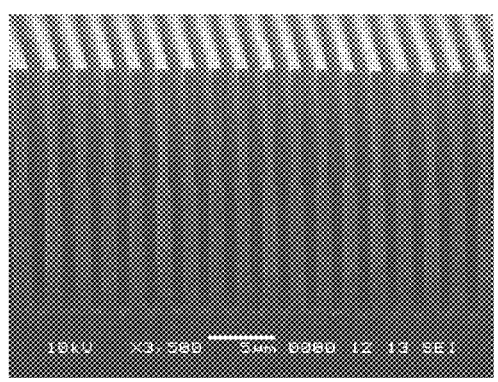
FIG. 14 is a photograph obtained by photographing a substrate used in Example 5 and having an unevenness (unevenness formed by grooves) in the surface thereof, in an oblique direction.

Film formation was carried out on the substrate using an apparatus obtained by connecting three apparatuses shown in FIG. 2 in series. As the substrate, a silicon wafer substrate having an unevenness formed by trenches shown in FIG. 14, in which the opening width of the concave portion was 1 µm, the opening depth of the concave portion was 20 µm, and the aspect ratio was 20 thereof, in the surface was used.

A yellow transparent solution in a molar concentration of 0.2 mol/L was obtained by dissolving tris(acetylacetonato) indium in acetylacetone. The raw material solution was prepared by adding di-n-butyl tin diacetate to the solution in such a manner that the content of tin elements became 5 moles with respect to 1 mole of indium elements (the content of the tin elements became 5 parts by mass with respect to 1 part by mass of the indium elements).

A temperature inside the film forming furnace 60 was set to a range of 498° C. to 509° C. The raw material solution was made into fine liquid droplets (mist) with ultrasonic waves of 800 kHz, and the fine liquid droplets were introduced into the film forming furnace 60 through the supply passage 61 in combination with dry air in a flow rate of 83 L/minute. A differential pressure between the exhaust passage 62 and the supply passage 61 was set to 30 Pa. In a case of setting the above-described conditions, a supply rate of the raw material solution became 4.35 g/minute, and the supply continued at this supply rate for 10 minutes.

The substrate was provided on the belt 50 of the belt conveyer, the substrate was sufficiently preheated at 500° C. Then, the velocity of the belt conveyer was set to 47 cm/minute, and the substrate was conveyed into the film forming furnace 60. The fine liquid droplets were deposited on the substrate and were crystallized to form an ITO film. After the film formation, annealing was carried out at the same temperature in a nitrogen atmosphere. This operation was repeated three times during a course of passing the substrate through the three film forming furnace.

Figure 15:
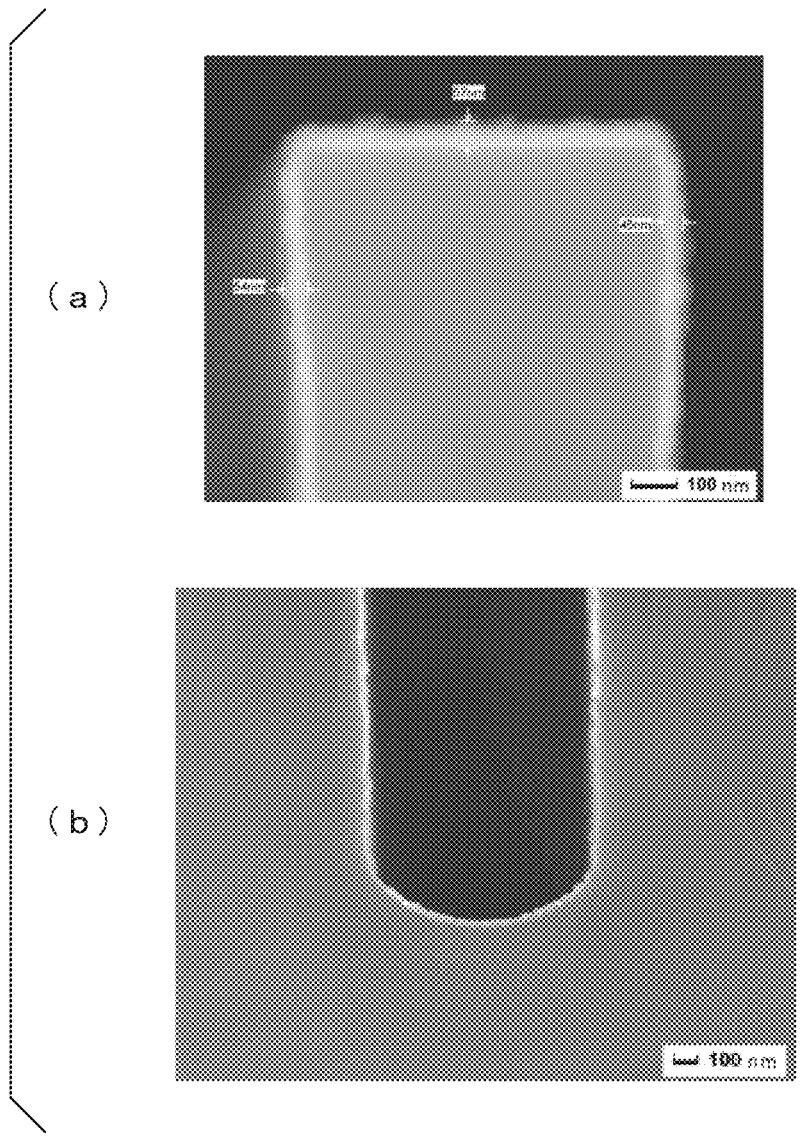
FIG. 15(a) is a high-magnification electronic photograph obtained by photographing an apex side of one projecting portion of a surface obtained by cutting a laminated body obtained in Example 5 in a direction perpendicular to the longitudinal direction of grooves.
FIG. 15(b) is a high-magnification electronic photograph obtained by photographing a bottom side of one concave portion of the cut surface.

FIGS. 15(*a*) and 15(*b*) show electronic photographs of a cross-section obtained by cutting the substrate after the film formation in a direction perpendicular to a longitudinal direction of one of the trenches. From the electronic photographs, it was confirmed that the ITO film was formed in an approximately uniform film thickness on the side wall surface and the bottom surface of the concave portion, and the apex surface of the convex portion. The ITO film that was formed had a thickness of 57 nm at the apex surface of the convex portion, a thickness of 54 nm at an apex-side portion of the side wall surface, a thickness of 38 nm at a bottom-side portion of the side wall surface, and a thickness of 39 nm at the bottom surface of the concave portion. The step coverage ratio was 81%.

Example 6

Figure 16:
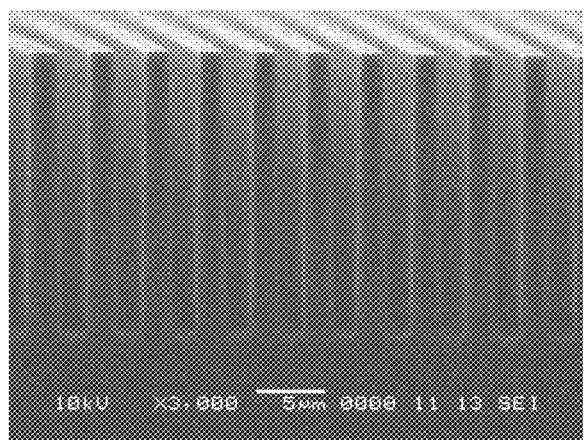
FIG. 16 is a photograph obtained by photographing a substrate used in Example 6 and having an unevenness (unevenness formed by grooves) in the surface thereof, in an oblique direction.

Film formation was carried out on the substrate using the film forming apparatus shown in FIG. 1. As the substrate, a silicon wafer substrate having an unevenness formed by trenches shown in FIG. 16, in which the opening width of the concave portion was 2 μm, the opening depth of the concave portion was 20 μm, and the aspect ratio thereof was 10, in the surface was used.

A yellow transparent solution in a molar concentration of 0.09 mol/L was obtained by dissolving bis(acetylacetonato) zinc ($Zn(AcAc)_2$) in ethanol. The raw material solution was prepared by adding tris(acetylacetonato)aluminum (Al $(AcAc)_3$) to the solution in such a manner that the content of aluminum elements became 2 moles with respect to 1 mole of zinc elements.

The temperature of the heaters 7 was set to approximately 450° C. In addition, a gas (dry air) flow rate in the film forming furnace 6 was set to 10 L/minute. The heating in the film forming furnace 6 was carried out from both an upper side and a lower side of the substrate 8 using the heaters 7. The height of the film forming furnace 6 was set to 1 cm.

The raw material solution was made into fine liquid droplets (mist) with ultrasonic waves of 800 kHz, and the liquid droplets were introduced to the film forming furnace 6 through the supply passage 4.

In a case of setting the above-described conditions, a supply rate of the raw material solution became 4.0 g/minute, and the supply continued at this supply rate for 5 minutes.

The substrate 8 was provided on the heater 7. Firstly, the substrate 8 was sufficiently preheated to 450° C., and then the fine liquid droplets were deposited on the substrate 8, and were crystallized to form the AZO film. After the film formation, annealing was carried out at the same temperature in a nitrogen atmosphere.

Figure 17:
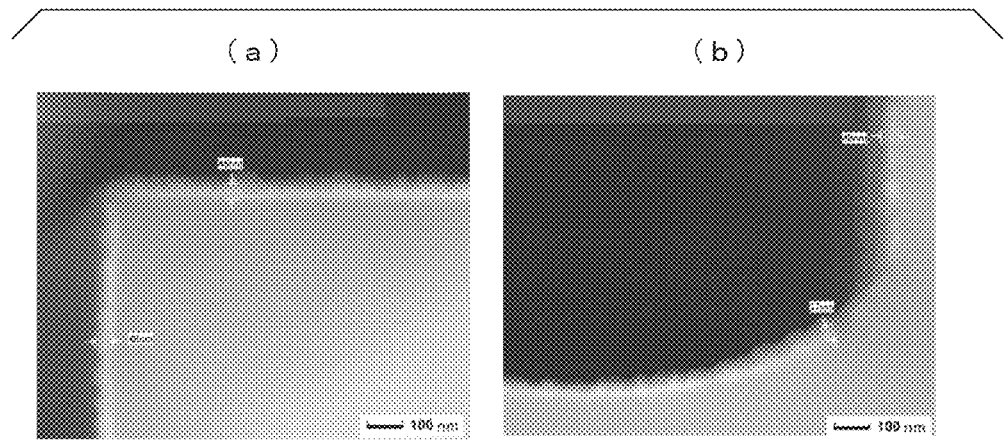
FIG. 17(a) is a high-magnification electronic photograph obtained by photographing a part of an apex side of one convex portion of a surface obtained by cutting a laminated body obtained in Example 6 in a direction perpendicular to the longitudinal direction of grooves.
FIG. 17(b) is a high-magnification electronic photograph obtained by photographing a part of a bottom side of one concave portion of the cut surface.

FIGS. 17(*a*) and 17(*b*) show photographs of a cross-section obtained by cutting the substrate after the film formation in a direction perpendicular to a longitudinal direction of one of the trenches. From the electronic photographs, it could be seen that the AZO film was formed in an approximately uniform film thickness on the side wall surface and the bottom surface of the concave portion, and the apex surface of the convex portion. The AZO film that was formed had a thickness of 45 nm at the apex surface of the convex portion, a thickness of 48 nm at an apex-side portion of the side wall surface, a thickness of 49 nm at a bottom-side portion of the side wall surface, and a thickness of 35 nm at the bottom surface of the concave portion. The step coverage ratio was 108%.

Comparative Example 1

As the substrate, the same silicon wafer substrate as Example 5 was used.

Under conditions in which an ITO target was used, an arrival pressure was set to $5\times10^{-4}$ Pa, 18 (sccm) of Ar gas and 2 (sccm) of $O_2$ gas were used as the carrier gas, and a pressure was set to 0.1 Pa, film formation was carried out with respect to the substrate that is horizontally provided for a time taken to obtain a film thickness of 50 nm.

Figure 18:
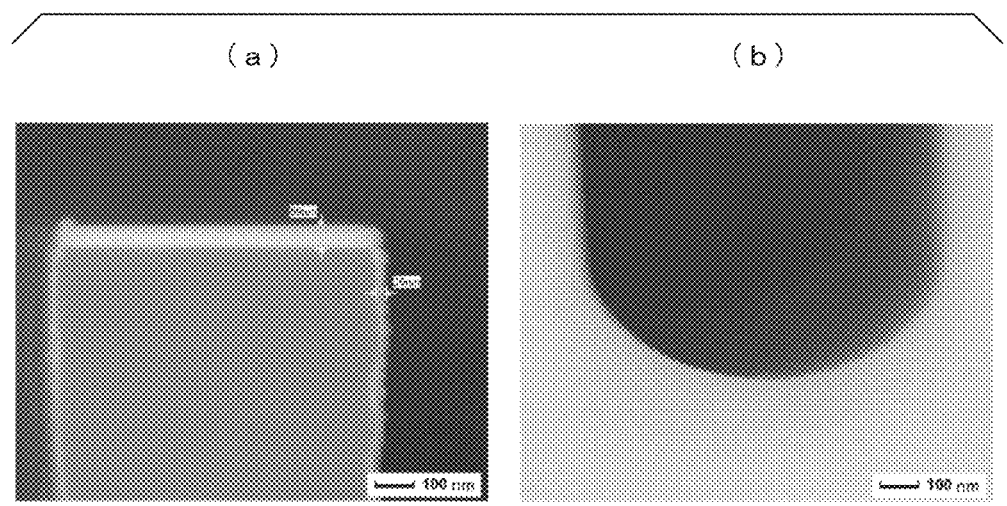
FIG. 18(a) is a high-magnification electronic photograph obtained by photographing an apex side of one convex portion of a surface obtained by cutting a laminated body obtained in Comparative Example 1 in a direction perpendicular to the longitudinal direction of grooves.
FIG. 18(b) is a high-magnification electronic photograph obtained by photographing a bottom side of one concave portion of the cut surface.

FIGS. 18(*a*) and (*b*) show photographs of a cross-section obtained by cutting the substrate after the film formation in a direction perpendicular to a longitudinal direction of one of the trenches. Although the ITO film that was formed had a thickness of 59 nm at the apex surface of the convex portion, and a thickness of 29 nm at the apex-side portion of the side wall surface, the thicknesses at the bottom-side portion of the side wall surface and the bottom surface of the concave portion could not be measured. The step coverage ratio was 25%.

INDUSTRIAL APPLICABILITY

According to the manufacturing process of the present invention, it is possible to easily obtain a laminated body including a substrate that has an unevenness with an aspect ratio of 1.5 to 100 in the surface thereof, and a conductive film that is laminated in an approximately uniform thickness on a bottom, side wall surfaces, and an apex of the unevenness. According to the manufacturing process of the present invention, it is possible to form a conductive film in an approximately uniform thickness even in a case of a large contact hole or the like in which an aspect ratio thereof is large. As a result, contact failure does not occur.

The laminated body of the present invention may be used in flat panel displays (a liquid crystal display, an electroluminescence display, or the like), planar heat generating bodies, touch panels, semiconductor devices, or the like.

REFERENCE SIGNS LIST

1: Raw material solution tank
2: Ultrasonic atomizer
3: Controller
5: Heater (preheating device)
50: Belt (conveyer)
6, 60: Film forming furnace
4, 61: Supply passage
9, 62: Exhaust passage
63: Muffle main body 7, 80: Heater (heating device)
8: Substrate

The invention claimed is:

1. A manufacturing process of a laminated body comprising:
   a substrate having an unevenness with an aspect ratio of 1.5 to 100 in a surface thereof; and
   a conductive film that is laminated in an approximately uniform thickness on a bottom, side wall surfaces, and an apex of the unevenness, the conductive film being a tin-doped indium oxide film,
   the process comprising:
   preparing the tin-doped indium oxide film on the substrate using a pyrosol process in which a solution comprising:
      an indium compound represented by Formula (I): $In(R^1COCHCOR^2)_3$ (wherein $R^1$ and $R^2$ each independently represent an alkyl group having 1 to 10 carbon atoms or a phenyl group); and
      a tin compound represented by Formula (II): $(R^3)_2Sn(OR^4)_2$ (wherein $R^3$ represents an alkyl group having 1 to 10 carbon atoms and $R^4$ represents an alkyl group having 1 to 10 carbon atoms or an acyl group having 1 to 10 carbon atoms) is used.

2. The manufacturing process according to claim 1, wherein a heating temperature of the substrate is 300° C. to 800° C.

3. The manufacturing process according to claim 1, wherein the unevenness is formed by needle-shaped protrusions, columnar protrusions, longitudinal holes, micropores, or grooves.

4. The manufacturing process according to claim 1, wherein the tin-doped indium oxide film is formed in such a manner that a step coverage ratio becomes 60 to 120%.

5. The manufacturing process according to claim 4, wherein the tin-doped indium oxide film is formed in such a manner that a step coverage ratio becomes 80 to 120%.

6. A manufacturing process of a laminated body comprising:
   a substrate having an unevenness with an aspect ratio of 1.5 to 100 in a surface thereof; and
   a conductive film that is laminated in an approximately uniform thickness on a bottom, side wall surfaces, and an apex of the unevenness, the conductive film being a tin-doped indium oxide film, the process comprising:
      atomizing a solution comprising an indium compound represented by Formula (I): $In(R^1COCHCOR^2)_3$ (wherein $R^1$ and $R^2$ each independently represent an alkyl group having 1 to 10 carbon atoms or a phenyl) and a tin compound represented by Formula (II): $(R^3)_2Sn(OR^4)_2$ (wherein $R^3$ represents an alkyl group having 1 to 10 carbon atoms, and $R^4$ represents an alkyl group having 1 to 10 carbon atoms or an acyl group having 1 to 10 carbon atoms);
      heating the substrate;
      bringing the resultant atomized material into contact with the substrate that is heated; and
      thermally decomposing the indium compound and the tin compound on the substrate to prepare the tin-doped indium oxide film.

7. The manufacturing process according to claim 6, wherein a heating temperature of the substrate is 300° C. to 800° C.

8. The manufacturing process according to claim 6, wherein the unevenness is formed by needle-shaped protrusions, columnar protrusions, longitudinal holes, micropores, or grooves.

9. The manufacturing process according to claim 6, wherein the tin-doped indium oxide film is formed in such a manner that a step coverage ratio becomes 60 to 120%.

10. The manufacturing process according to claim 9, wherein the tin-doped indium oxide film is formed in such a manner that a step coverage ratio becomes 80 to 120%.

* * * * *